(12) United States Patent
Li et al.

(10) Patent No.: US 12,279,407 B2
(45) Date of Patent: Apr. 15, 2025

(54) POWER CORD AND RELATED ELECTRICAL CONNECTORS AND ELECTRICAL APPLIANCES

(71) Applicant: Chengli Li, Suzhou (CN)

(72) Inventors: Chengli Li, Suzhou (CN); Long Chen, Suzhou (CN)

(73) Assignee: Chengli Li, Suzhou (CN)

( * ) Notice: Subject to any disclaimer, the term of this patent is extended or adjusted under 35 U.S.C. 154(b) by 162 days.

(21) Appl. No.: 18/118,305

(22) Filed: Mar. 7, 2023

(65) Prior Publication Data

US 2024/0292586 A1  Aug. 29, 2024

(30) Foreign Application Priority Data

Feb. 28, 2023  (CN) .......................... 202310174192.7
Feb. 28, 2023  (CN) .......................... 202320333262.4

(51) Int. Cl.
*H01B 9/00* (2006.01)
*H02H 7/22* (2006.01)
*H05K 9/00* (2006.01)

(52) U.S. Cl.
CPC ............ *H05K 9/0098* (2013.01); *H01B 9/00* (2013.01); *H02H 7/226* (2013.01)

(58) Field of Classification Search
CPC .......... H05K 9/00; H05K 9/0098; H01B 9/00; H01B 13/22; H01B 7/32; H02H 7/22; H02H 7/226; H02H 3/16
USPC ..................................................... 361/42–50
See application file for complete search history.

(56) References Cited

U.S. PATENT DOCUMENTS

| | | | |
|---|---|---|---|
| 10,825,582 B1* | 11/2020 | Mashio | H01B 9/006 |
| 11,979,016 B1* | 5/2024 | Aromin | G01R 31/086 |
| 2021/0125753 A1* | 4/2021 | Aromin | H01B 13/22 |

FOREIGN PATENT DOCUMENTS

| | | |
|---|---|---|
| CN | 201066598 Y | 5/2008 |
| CN | 102024520 A | 4/2011 |
| CN | 106448849 B | 1/2018 |
| CN | 215183190 U | 12/2021 |

OTHER PUBLICATIONS

Decision by the Chinese National Intellectual Property Administration (CNIPO) in corresponding Chines Utility Model Application CN 202320333262.4, mailed on Nov. 19, 2024.

* cited by examiner

*Primary Examiner* — Danny Nguyen
(74) *Attorney, Agent, or Firm* — Chen Yoshimura LLP

(57) ABSTRACT

A power cord includes at least two power supply lines, at least two insulation layers respectively covering the power supply lines, first and second shield layers respectively disposed around corresponding insulating layers to detect leakage currents on the corresponding power supply lines, at least one shield insulating layer disposed between the first and second shield layers to electrically insulate them from each other, a first and a second signal conductor disposed either between the first (or second) shield layer and the corresponding insulation layer or outside the first (or second) shield layer. Each signal conductors is formed of at least one conductor wire and at least one filament in a twisted or woven structure and configured to conduct the leakage current. The signal conductors have great tensile strength which solves the problem of breaking of the signal conductors.

20 Claims, 14 Drawing Sheets

POWER CORD AND RELATED ELECTRICAL CONNECTORS AND ELECTRICAL APPLIANCES

BACKGROUND OF THE INVENTION

Field of the Invention

This invention relates to electrical devices, and in particular, it relates to a power cord and related electrical connectors and electrical appliances.

Description of Related Art

Leakage current detection and interruption (LCDI) device is a fire hazard prevention device for electrical appliances. It is implemented in a power cord with a plug, and functions to detect any leakage current between the hot or neutral power supply lines and their shield layers along the power cord from the plug to the electrical load (e.g., air conditioner, dehumidifier, etc.). When a leakage current is detected, the LCDI device can disconnect the electrical power from the power source to the appliance, preventing fire hazard and ensuring safety. Thus, LCDI devices can prevent fire hazard caused by arc fault due to physical damage and lost of insulation in the power cord, which may be caused by aging of the hot, neutral and ground wires, wear, pinching, animal chewing, etc.

In some conventional power cords having an LCDI function, one or more signal conductor wires are provided in the cord and disposed along and in electrical contact with the shield layer of the power supply lines. However, because such signal conductor wires tend to have weak tensile strength, they are prone to breaking due to bending or stretching of the cord during normal use, which can cause the LCDI device to be defective.

SUMMARY

Therefore, there is a need for a power cord that solves the above-described signal conductor breaking problem.

To achieve the above objects, the present invention provides a power cord, which includes: at least two power supply lines; at least two insulation layers respectively covering corresponding ones of the at least two power supply lines; a first shield layer and a second shield layer, respectively disposed around corresponding two of the at least two insulating layers, respectively configured to detect leakage currents on the corresponding power supply lines; at least one shield insulating layer, disposed between the first and second shield layers, configured to electrically insulate the first and second shield layers from each other; a first signal conductor disposed either between the first shield layer and the corresponding insulation layer or outside the first shield layer, and electrically coupled to the first shield layer; and a second signal conductor disposed either between the second shield layer and the corresponding insulation layer or outside the second shield layer, and electrically coupled to the second shield layer; wherein each of the first and second signal conductors is formed of at least one conductor wire and at least one filament in a twisted or woven structure.

In some embodiments, the conductor wire is a metal wire or a carbon filament, and the filament is a Kevlar filament, a nylon filament, or a glass filament.

In some embodiments, the first and second signal conductors have superior solderability than the first and second shield layers.

In some embodiments, the first signal conductor is either disposed in parallel with or wound around the corresponding power supply line.

In some embodiments, the second signal conductor is either disposed in parallel with or wound around the corresponding power supply line.

In some embodiments, the first shield layer is independent of the at least one shield insulating layer, and/or the second shield layer is independent of the at least one shield insulating layer.

In some embodiments, the first shield layer is formed integrally with one of the at least one shield insulating layer as an integral structure, and wherein at lease a portion of an inner surface of the integral structure is the first shield layer; and/or the second shield layer is formed integrally with one of the at least one shield insulating layer as an integral structure, and wherein at lease a portion of an inner surface of the integral structure is the second shield layer.

In some embodiments, an area of the first shield layer is smaller than an area of the one of the at least one shield insulating layer, and/or an area of the second shield layer is smaller than an area of the one of the at least one shield insulating layer.

In some embodiments, the at least one shield insulating layer covers at least one of the first shield layer, the second shield layer, the first signal conductor, and the second signal conductor, and the at least one shield insulating layer is formed of an insulating plastic film or insulating paper.

In some embodiments, the first signal conductor and second signal conductor are electrically coupled to each other.

In some embodiments, the first signal conductor and second signal conductor are electrically isolated from each other.

In another aspect, the present invention provides an electrical connector, which includes a leakage current detection and interruption device and the power cord according to any of the above embodiments, electrically coupled to the leakage current detection and interruption device.

In another aspect, the present invention provides an electrical appliance, which includes an electrical load and the above electrical connector, coupled between an electrical power source and the load, configured to supply power to the electrical load.

In the power cord according to embodiments of the present invention, the tensile strength of the first and second signal conductors is greatly improved, solving the problem of the signal conductor line breaking when the cord is bent or stretched by external force, and enhancing the reliability of the LCDI device. Moreover, the power cord has a simple structure, is low cost and safe.

BRIEF DESCRIPTION OF THE DRAWINGS

Preferred embodiments of the present invention are described with reference to the drawings. These drawings explain the embodiments and their operating principle, and only illustrate structures that are necessary to the understanding of the invention. These drawings are not to scale. In the drawings, like features are designated by like reference symbols. In the block diagrams, lines between blocks represent electrical or magnetic coupling of the blocks; the absence of lines between blocks does not mean the lack of coupling.

DETAILED DESCRIPTION OF PREFERRED EMBODIMENTS

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc. In this disclosure, the above terms do not necessarily refer to the same embodiments. Further, the various features, structures, materials or characteristics may be suitably combined in any of the one or more embodiments. Those of ordinary skill in the art may combine the various embodiments and various characteristics of the embodiments described herein when they are not contrary to each other.

Embodiments of the present invention provide a power cord, in which the tensile strength of the signal conductor line is greatly improved. This solves the problem of the signal conductor breaking during normal use due to bending or stretching, improving the reliability of the LCDI power plug device. Further, the cord has a simple structure, and is low cost and safe.

Figure 1:
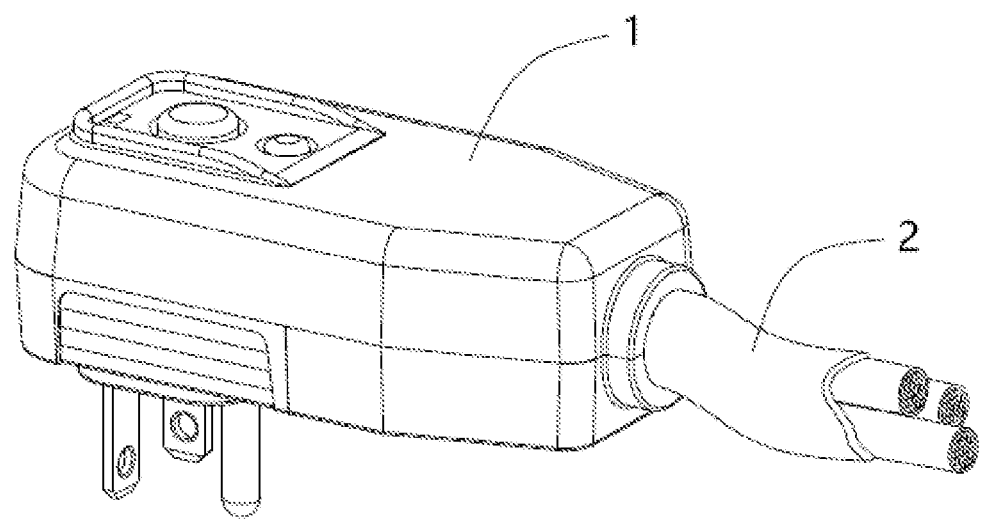
FIG. 1 is a partial cut-away view of an electrical connector (power plug) with a cord according to embodiments of the present invention.

FIG. 1 is a partial cut-away view of an electrical connector with a cord according to embodiments of the present invention. As shown in FIG. 1, the electrical connector includes an LCDI device 1 and a power cord 2 for supplying power to an electrical load. The LCDI device 1 has plug prongs configured to be inserted into a power receptacle. The power cord 2 is coupled to the LCDI device 1 at one end, and coupled to the load at the other end. The LCDI device 1 includes an electrical processing circuit 11, examples of which are shown in FIGS. 7-10 and described later.

Figure 2A:
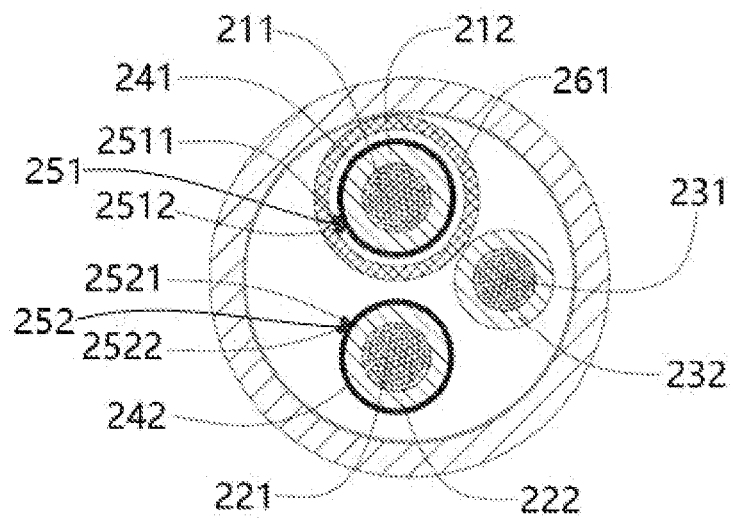
FIG. 2A is a cross-sectional view illustrating a power cord according to a first embodiment of the present invention.
Figure 2B:
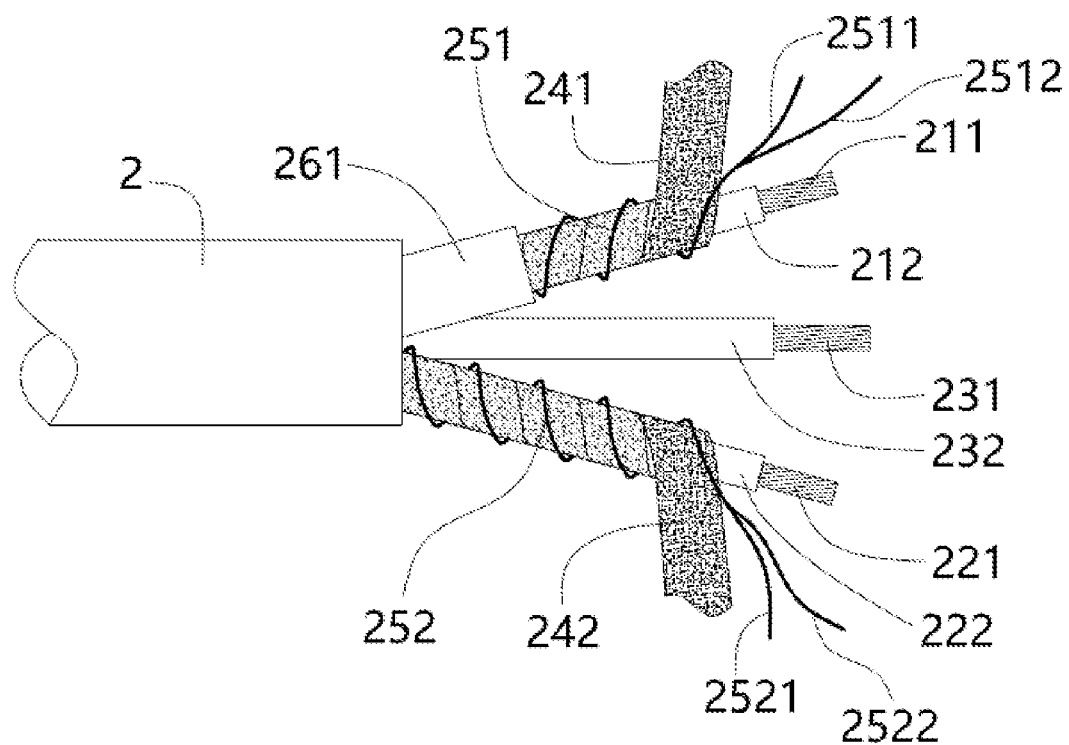
FIG. 2B is a partial cut-away and partially disassembled view showing the power cord of the first embodiment.

Refer to FIGS. 2A and 2B. FIG. 2A is a cross-sectional view illustrating a power cord according to a first embodiment of the present invention. FIG. 2B is a partial cut-away and partially disassembled view showing the power cord of the first embodiment. In this embodiment, the power cord 2 includes a first power supply line (current-carrying wire) 211, a second power supply line (current-carrying wire) 221 and a third power supply line (current-carrying wire) 231. A first insulation layer 212 covers the first power supply line 211, a second insulation layer 222 covers the second power supply line 221, and a third insulation layer 232 covers the third power supply line 231. A first shield layer 241 covers the first insulation layer 212, and functions to detect a leakage current on the first power supply line 211. A second shield layer 242 covers the second insulation layer 222, and functions to detect a leakage current on the second power supply line 221. It should be understood that because the first shield layer 241 and second shield layer 242 respectively detect leakage currents on the first power supply line 211 and second power supply line 221, the first shield layer 241 and second shield layer 242 preferably completely cover the surfaces of the corresponding insulating layers, to ensure reliable detection of leakage currents.

In this embodiment, the power cord 2 further includes a first signal conductor 251 and a second signal conductor 252. The first signal conductor 251 is formed of at least one conductor wire 2511 and at least one filament 2512 in a twisted or woven structure. The second signal conductor 252 is formed of at least one conductor wire 2521 and at least one filament 2522 in a twisted or woven structure. The conductor wires 2511 and 2521 may be, for example, metal wires, carbon filaments, or wires made of other conductive materials. The filaments 2512 and 2522 may be, for example, Kevlar filaments, nylon filaments, glass filaments, or filaments made of other materials with superior tensile properties. The first signal conductor 251 is spiral wound around the outer surface of the first shield layer 241, and is electrically coupled to the first shield layer 241. The first signal conductor 251 is further electrically coupled to the electrical processing circuit 11 of the LCDI device 1, and configured to conduct the leakage current detected by the first shield layer 241 to the electrical processing circuit 11. The second signal conductor 252 is spiral wound around the outer surface of the second shield layer 242, and is electrically coupled to the second shield layer 242. The second signal conductor 252 is further electrically coupled to the electrical processing circuit 11 of the LCDI device 1, and configured to conduct the leakage current detected by the second shield layer 242 to the electrical processing circuit 11.

In this embodiment, the side of the first shield layer 241 that contacts the first signal conductor 251 is a conductive surface, and the side of the second shield layer 242 that contacts the second signal conductor 252 is a conductive surface. The first shield layer 241 and second shield layer 242 may be metal films; alternatively, a conductive material may be coated on a band shaped material having sufficient mechanical strength to form the first shield layer 241 and second shield layer 242. The power cord 2 further includes a first shield insulating layer 261, which partially or completely covers the first signal conductor 251 and first shield layer 241, and functions to electrically insulate the first shield layer 241 and first signal conductor 251 from the second shield layer 242 and second signal conductor 252. Thus, the first shield layer 241 and first signal conductor 251 are electrically insulated from the second shield layer 242 and second signal conductor 252. As seen in FIGS. 2A and 2B, the shield insulating layer 261 and the first shield layer 241 are independent of each other, and are two separate layers.

Although in the illustrated embodiment, the shield insulating layer 261 covers the first signal conductor 251 and first shield layer 241, those skilled in the art will appreciate that the shield insulating layer 261 may alternatively cover the second signal conductor 252 and second shield layer 242. In another alternative embodiment, the power cord 2 has two shield insulating layers, respectively covering the first signal conductor 251 and first shield layer 241, and the second signal conductor 252 and second shield layer 242.

Figure 3A:
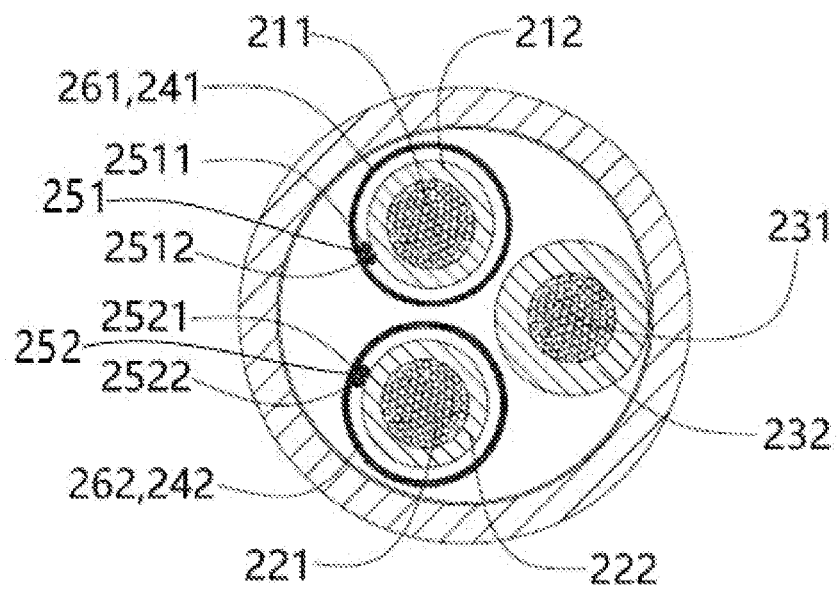
FIG. 3A is a cross-sectional view illustrating a power cord according to a second embodiment of the present invention.
Figure 3B:
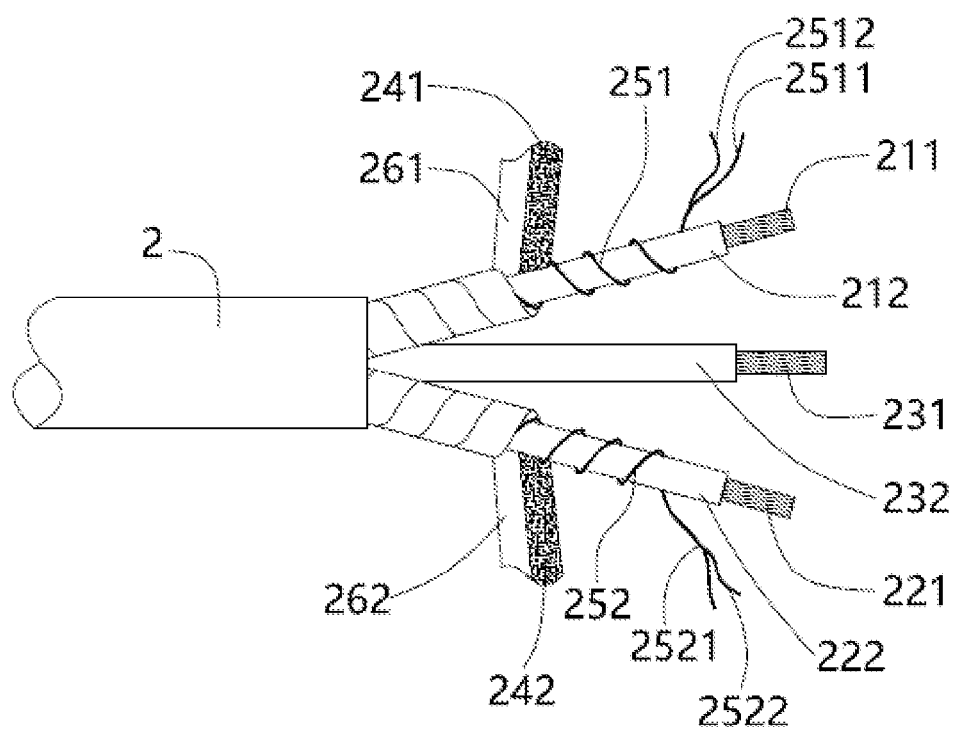
FIG. 3B is a partial cut-away and partially disassembled view showing the power cord of the second embodiment.
Figure 3C:
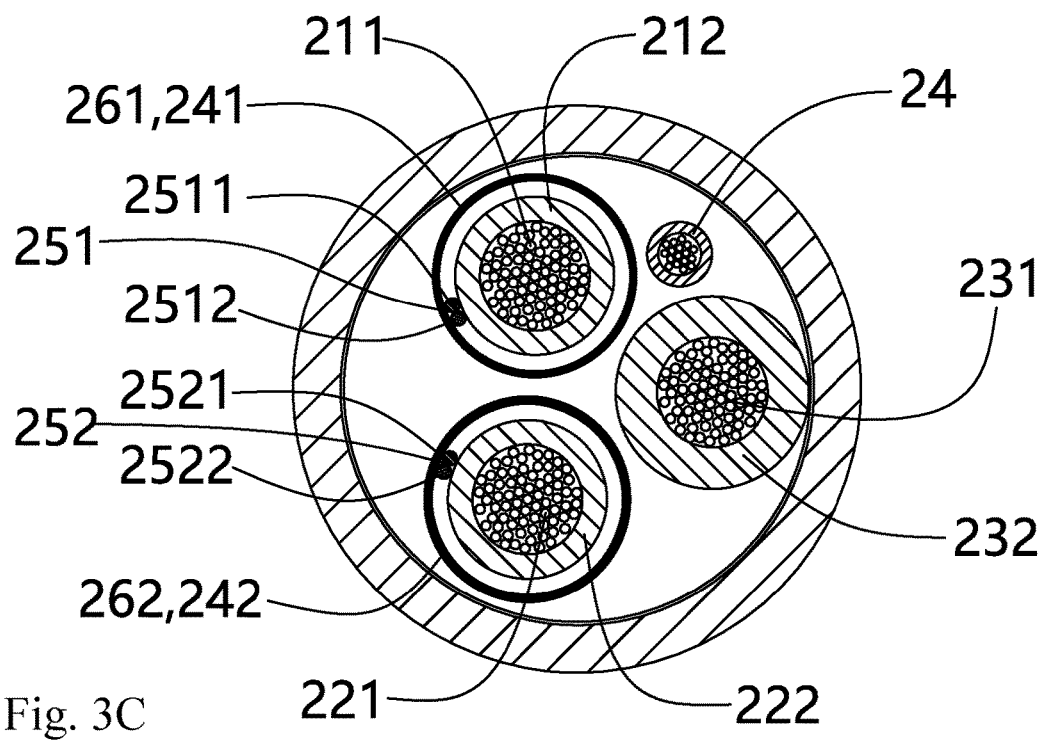
FIG. 3C is a cross-sectional view illustrating a power cord according to a variation of the second embodiment of the present invention.
Figure 3D:
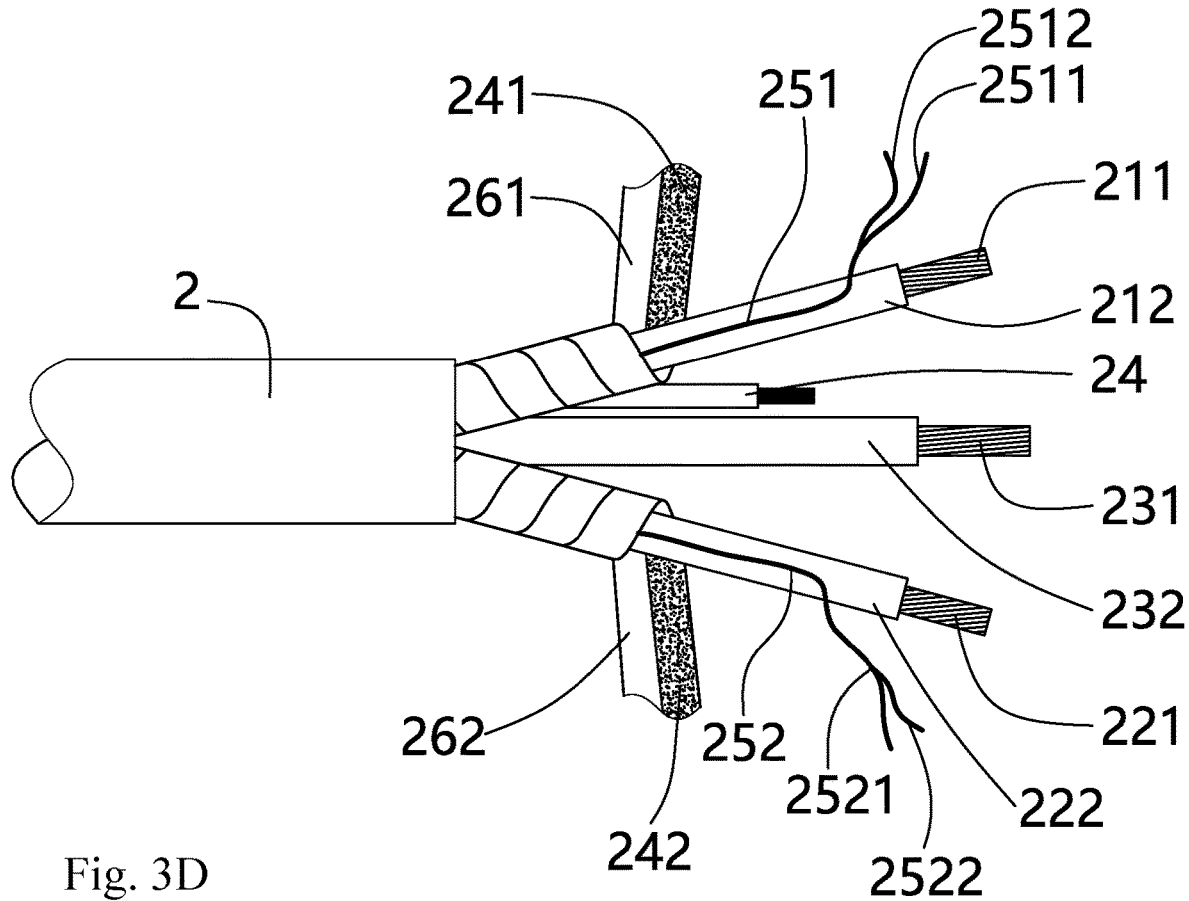
FIG. 3D is a partial cut-away and partially disassembled view showing the power cord of the variation of the second embodiment.
Figure 3E:
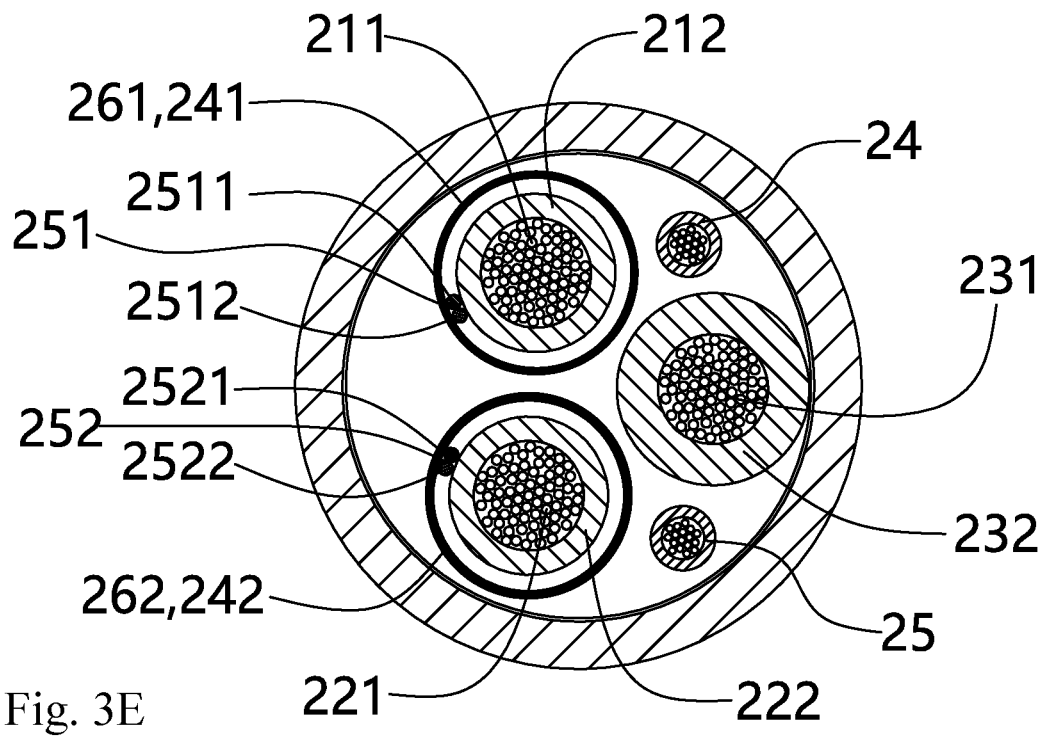
FIG. 3E is a cross-sectional view illustrating a power cord according to another variation of the second embodiment of the present invention.
Figure 3F:
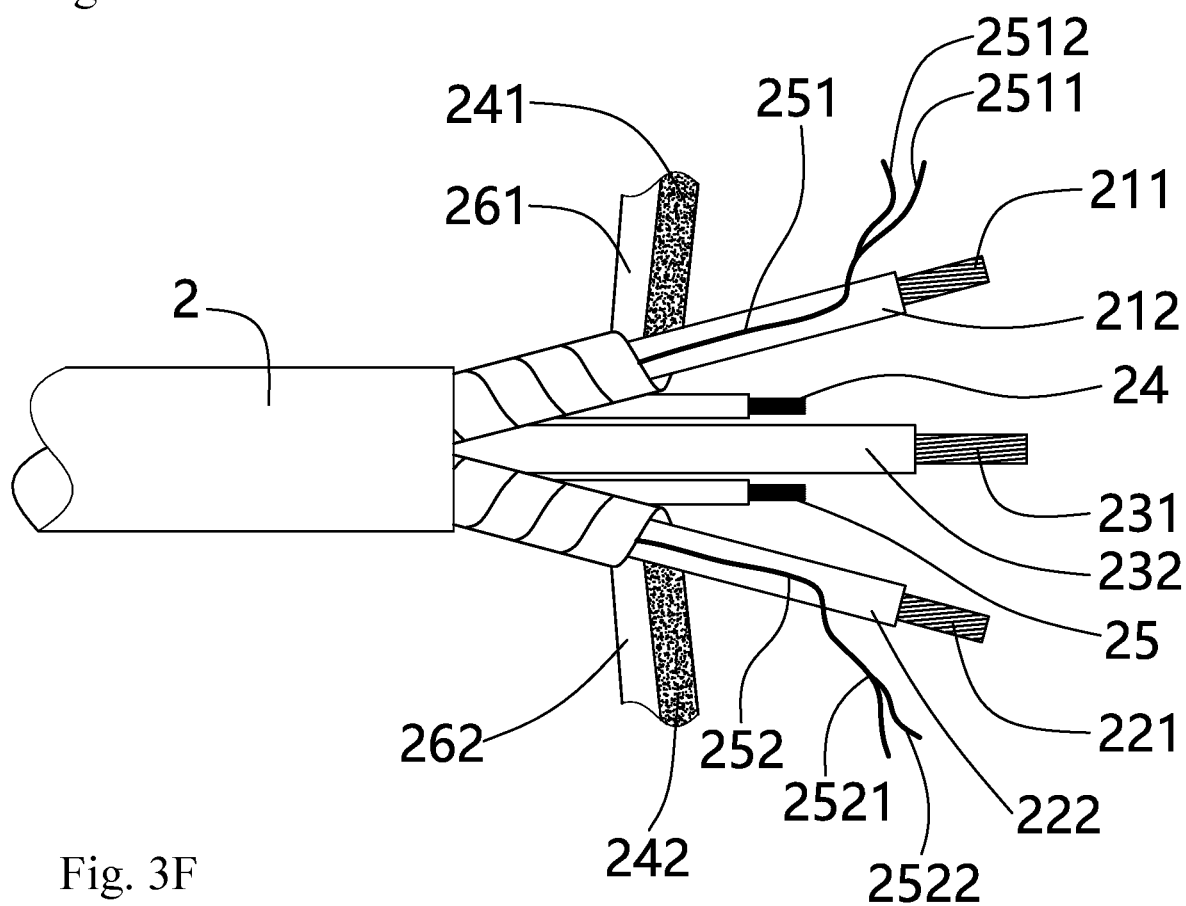
FIG. 3F is a partial cut-away and partially disassembled view showing the power cord of the other variation of the second embodiment.

Refer to FIGS. 3A and 3B. FIG. 3A is a cross-sectional view illustrating a power cord according to a second embodiment of the present invention. FIG. 3B is a partial cut-away and partially disassembled view showing the power cord of the second embodiment. In this embodiment, the power cord 2 includes a first power supply line 211, a second power supply line 221 and a third power supply line 231. A first insulation layer 212 covers the first power supply line 211, a second insulation layer 222 covers the second power supply line 221, and a third insulation layer 232 covers the third power supply line 231.

In this embodiment, the power cord 2 further includes a first signal conductor 251 and a second signal conductor 252. The first signal conductor 251 is formed of at least one conductor wire 2511 and at least one filament 2512 in a twisted or woven structure. The second signal conductor 252 is formed of at least one conductor wire 2521 and at least one filament 2522 in a twisted or woven structure. The conductor wires 2511 and 2521 may be, for example, metal wires, carbon filaments, or wires made of other conductive materials. The filaments 2512 and 2522 may be, for example, Kevlar filaments, nylon filaments, glass filaments, or filaments made of other materials with superior tensile properties. The first signal conductor 251 is disposed between the first insulation layer 212 and first shield layer 241, spiral wound around the first insulation layer 212, and electrically coupled to the first shield layer 241. The second signal conductor 252 is disposed between the second insulation layer 222 and second shield layer 242, spiral wound around the second insulation layer 222, and electrically coupled to the second shield layer 242. The first shield layer 241 covers the first signal conductor 251 and first insulation layer 212, and functions to detect a leakage current on the first power supply line 211. The second shield layer 242 covers the second signal conductor 252 and second insulation layer 222, and functions to detect a leakage current on the second power supply line 221. It should be understood that because the first shield layer 241 and second shield layer 242 respectively detect leakage currents on the first power supply line 211 and second power supply line 221, the first shield layer 241 and second shield layer 242 preferably completely cover the surface of the respective corresponding insulating layers, to ensure reliable detection of leakage currents. The first signal conductor 251 and the second signal conductor 252 have superior solderability than the first shield layer 241 and second shield layer 242. The first signal conductor 251 is further electrically coupled to the electrical processing circuit 11 of the LCDI device 1, and configured to conduct the leakage current detected by the first shield layer 241 to the electrical processing circuit 11. The second signal conductor 252 is further electrically coupled to the electrical processing circuit 11 of the LCDI device 1, and configured to conduct the leakage current signal detected by the second shield layer 242 to the electrical processing circuit 11.

As shown in FIG. 3A, the power cord 2 further includes a first shield insulating layer 261 and a second shield insulating layer 262, which function to electrically insulate the first shield layer 241 and first signal conductor 251 from the second shield layer 242 and second signal conductor 252. Thus, the first shield layer 241 and first signal conductor 251 are electrically insulates from the second shield layer 242 and second signal conductor 252. In this embodiment, the first shield insulating layer 261 and second shield insulating layer 262 are insulating plastic films or insulating paper, and the first shield layer 241 and second shield layer 242 are metal films respectively adhered to the inner surfaces of the shield insulating layer 261 and second shield insulating layer 262 (i.e. the surfaces facing the first signal conductor 251 and second signal conductor 252, respectively). The first shield layer 241 and second shield layer 242 are respectively formed integrally with the first shield insulating layer 261 and second shield insulating layer 262; i.e., the respective integral (one-piece) structure is formed by a plastic film as a main body with a metal film adhered to at least some portions of the inner surface of the plastic film to constitute the first shield layer 241 or second shield layer 242.

As shown in FIG. 3B, in the illustrated embodiment, because the inner surface of the plastic film is partially (rather than completely) covered with the metal film, the total area of the insulating portions of the plastic film is the sum of the area of the outer surface and the area of the portions of the inner surface that is free of the metal film. Thus, the area of the metal film is smaller than the total area of the insulating portions of the plastic film. The insulating portions of the plastic film constitute the shield insulating layer 261 or 262. Thus, the area of the first shield layer 241 is smaller than the area of the first shield insulating layer 261, and the area of the second shield layer 242 is smaller than the area of the second shield insulating layer 262. Such a structure ensures that after the integral structure is wound around the first insulation layer 212 and second insulation layer 222, the first shield layer 241 and second shield layer 242 are completely insulated from each other.

Although in the illustrated embodiment, the power cord 2 includes the first shield insulating layer 261 and the second shield insulating layer 262, which are respectively formed as integral structures with the first shield layer 241 and second shield layer 242, those having ordinary skill in the art would appreciate that alternatively, the power cord may include only one integral structure of first shield insulating layer 261 and first shield layer 241, with the integral structure of the second shield insulating layer 262 and second shield layer 242 in FIGS. 3A and 3B replaced by the second shield layer 242 in FIGS. 2A and 2B. In another alternative, the integral structure of the second shield insulating layer 262 and second shield layer 242 in FIGS. 3A and 3B is replaced by the separate second shield insulating layer 262 and second shield layer 242 shown in FIGS. 2A and 2B.

Figure 4A:
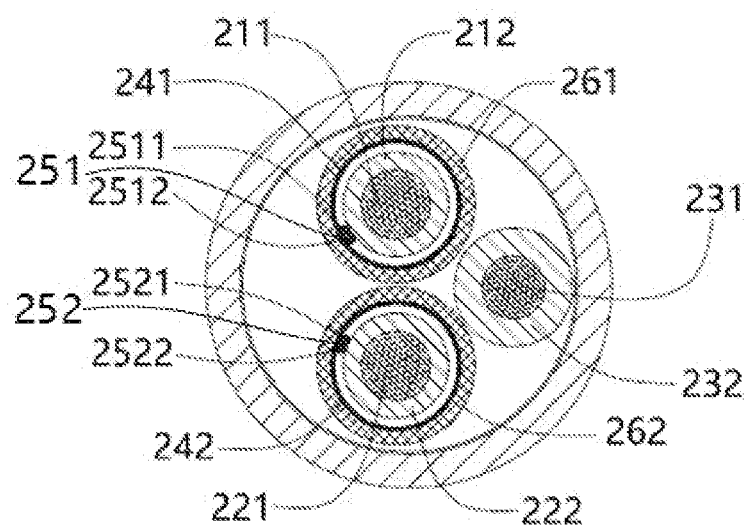
FIG. 4A is a cross-sectional view illustrating a power cord according to a third embodiment of the present invention.
Figure 4B:
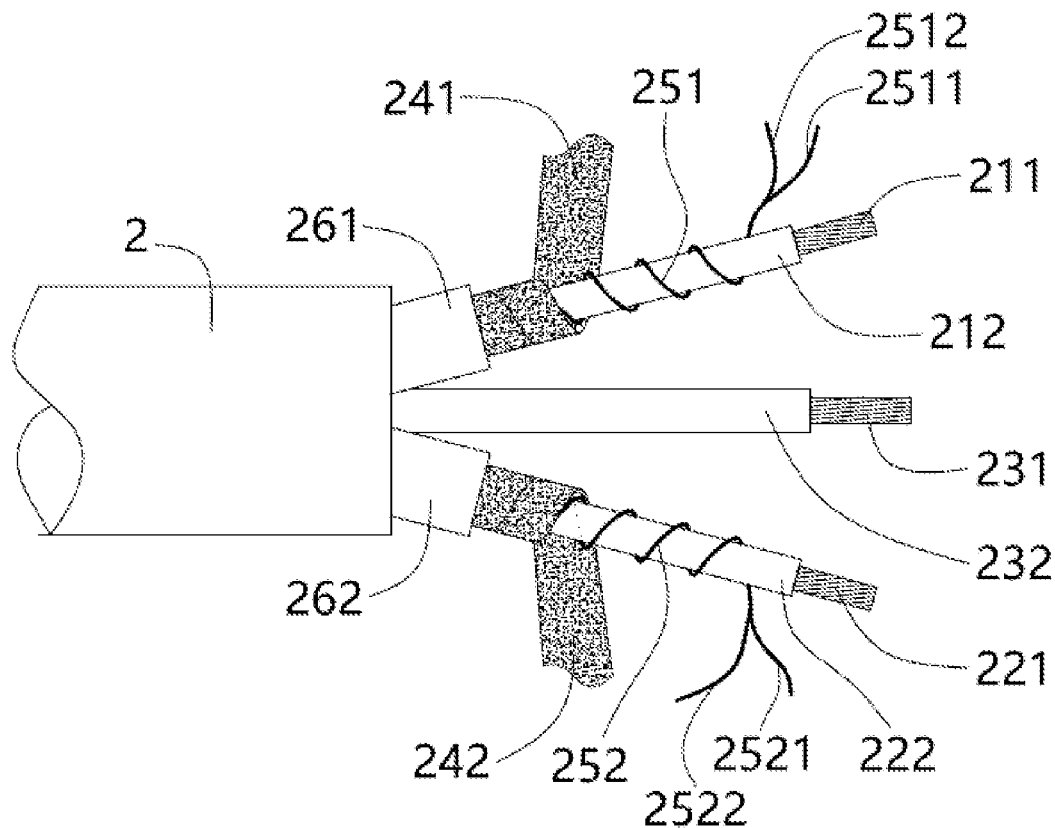
FIG. 4B is a partial cut-away and partially disassembled view showing the power cord of the third embodiment.

Refer to FIGS. 4A and 4B. FIG. 4A is a cross-sectional view illustrating a power cord according to a third embodiment of the present invention. FIG. 4B is a partial cut-away and partially disassembled view showing the power cord of the third embodiment. Comparing to the embodiment of FIGS. 3A and 3B, in the embodiment of FIGS. 4A and 4B, the first shield layer 241 and first shield insulating layer 261 of the power cord 2 are independent of each other as two separate layers, and the second shield layer 242 and second shield insulating layer 262 are independent of each other as two separate layers. The other aspects of the power cord 2 of FIGS. 4A and 4B are similar or identical to those of the embodiment of FIGS. 3A and 3B.

Figure 5A:
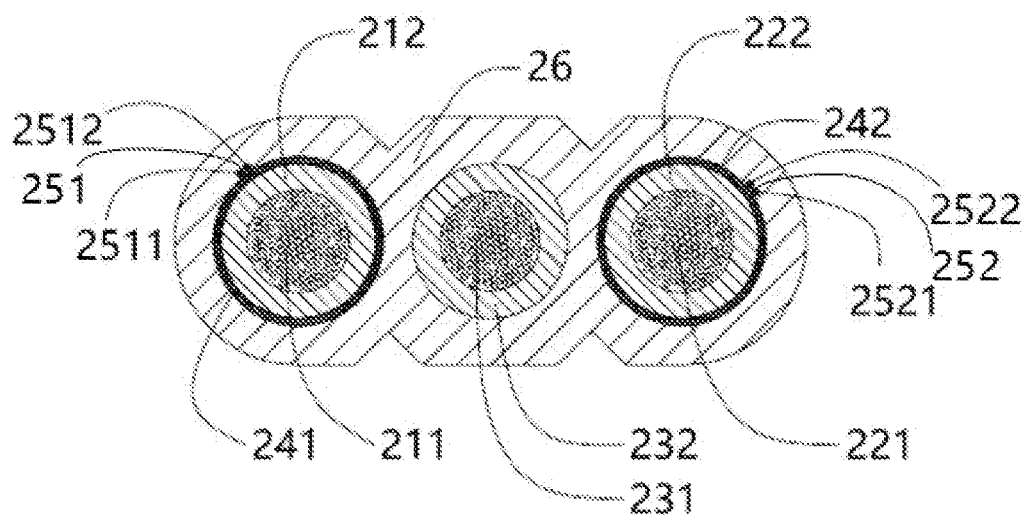
FIG. 5A is a cross-sectional view illustrating a power cord according to a fourth embodiment of the present invention.
Figure 5B:
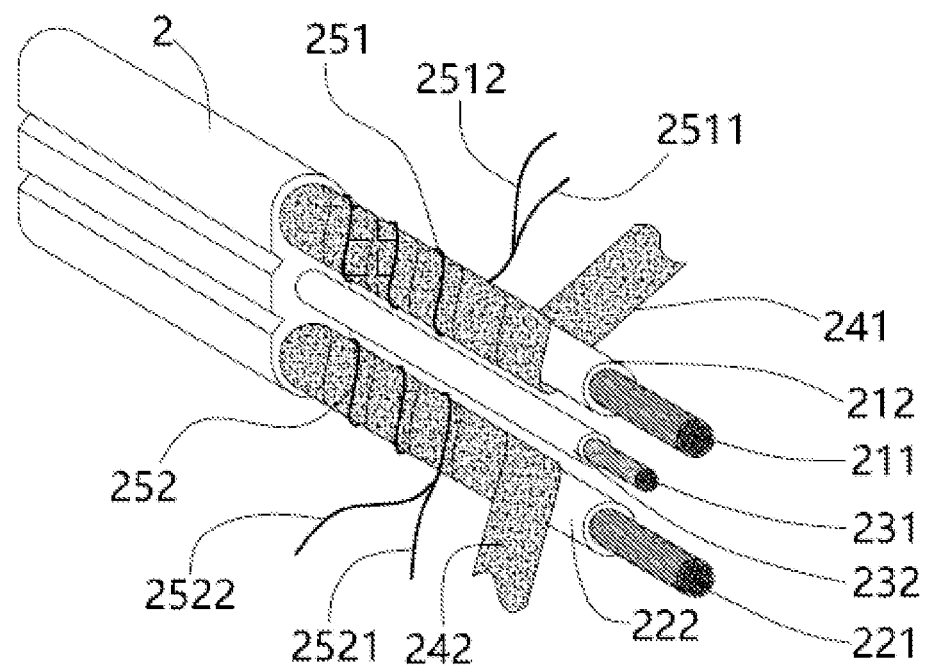
FIG. 5B is a partial cut-away and partially disassembled view showing the power cord of the fourth embodiment.
Figure 5C:
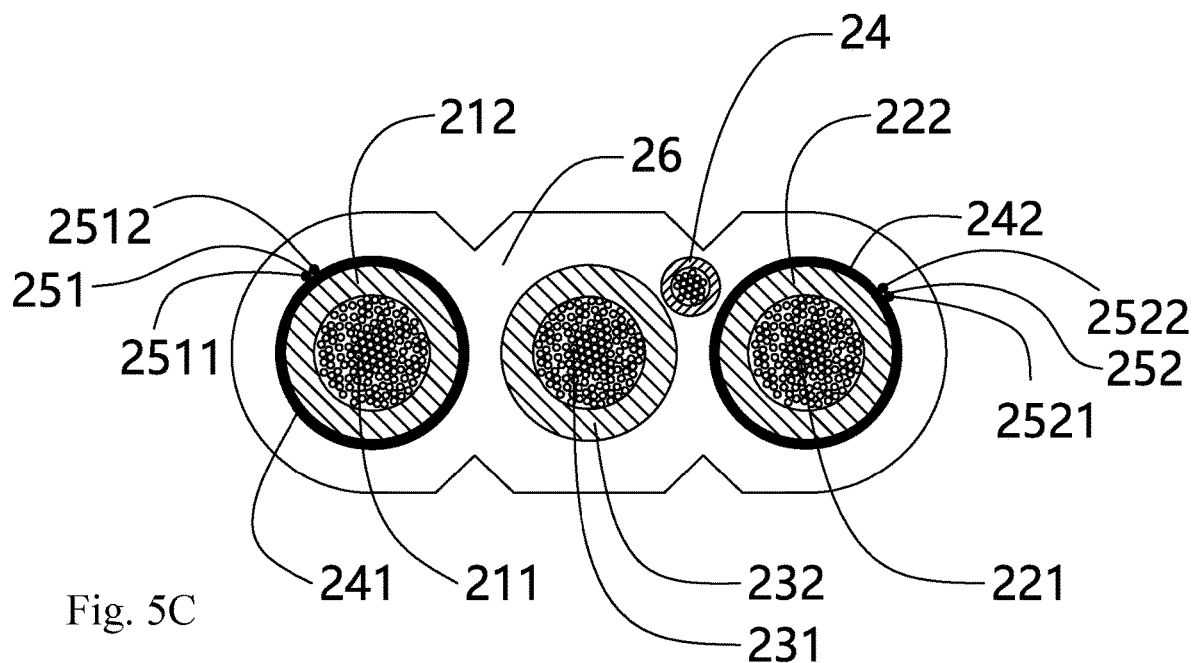
FIG. 5C is a cross-sectional view illustrating a power cord according to a variation of the fourth embodiment of the present invention.
Figure 5D:
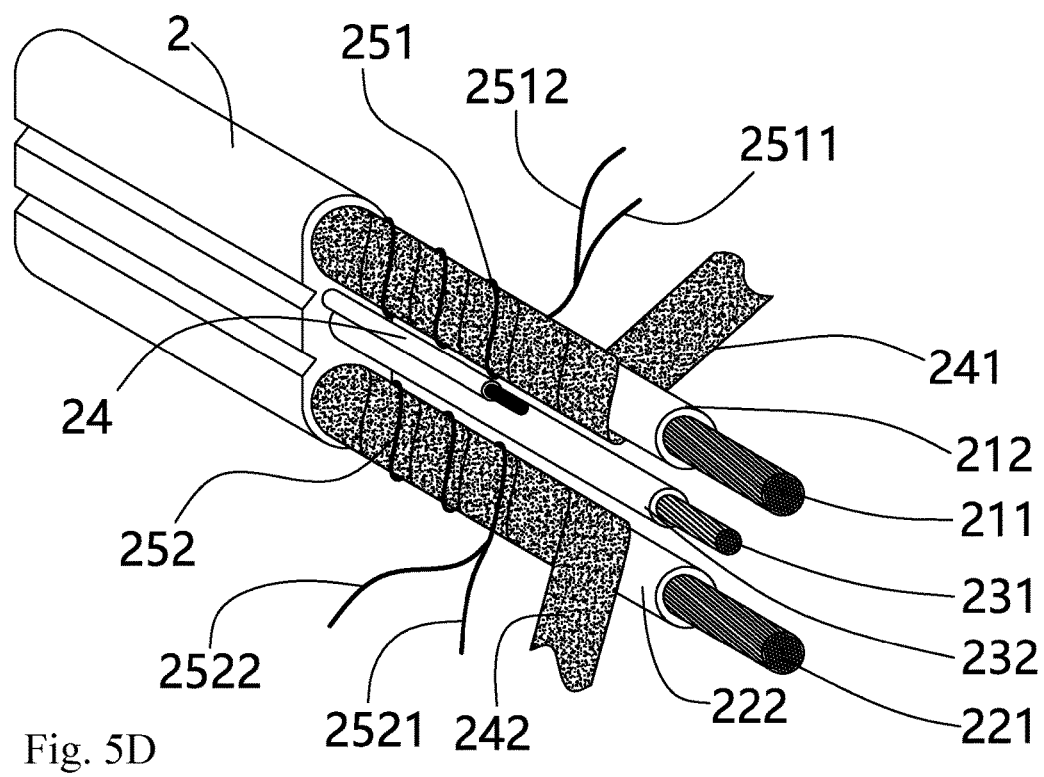
FIG. 5D is a partial cut-away and partially disassembled view showing the power cord of the variation of the fourth embodiment.
Figure 5E:
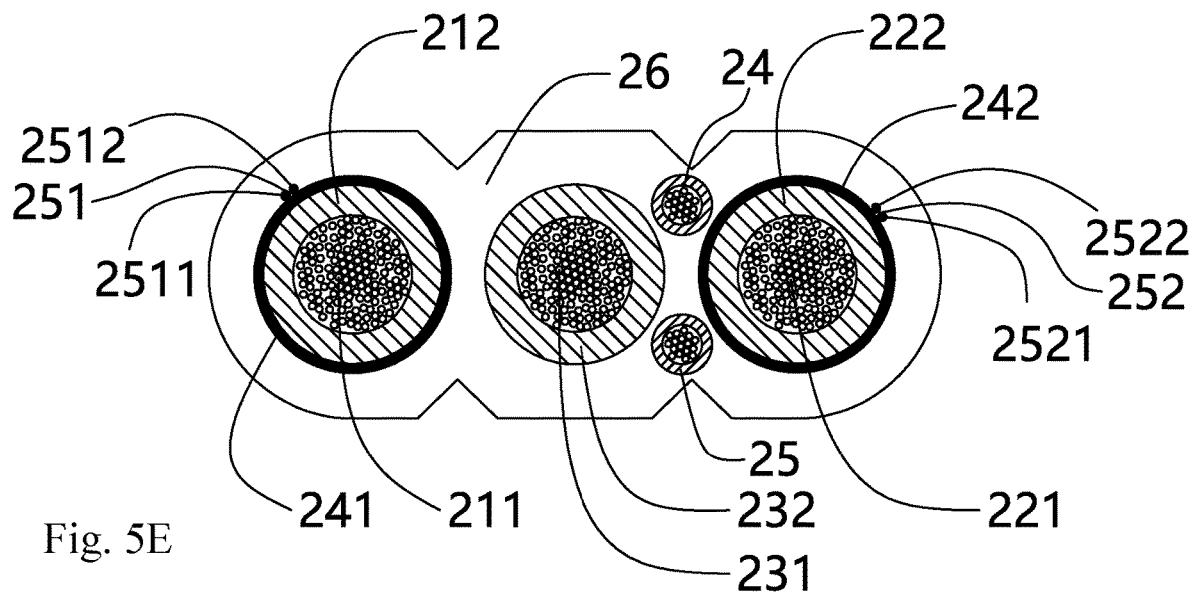
FIG. 5E is a cross-sectional view illustrating a power cord according to another variation of the fourth embodiment of the present invention.
Figure 5F:
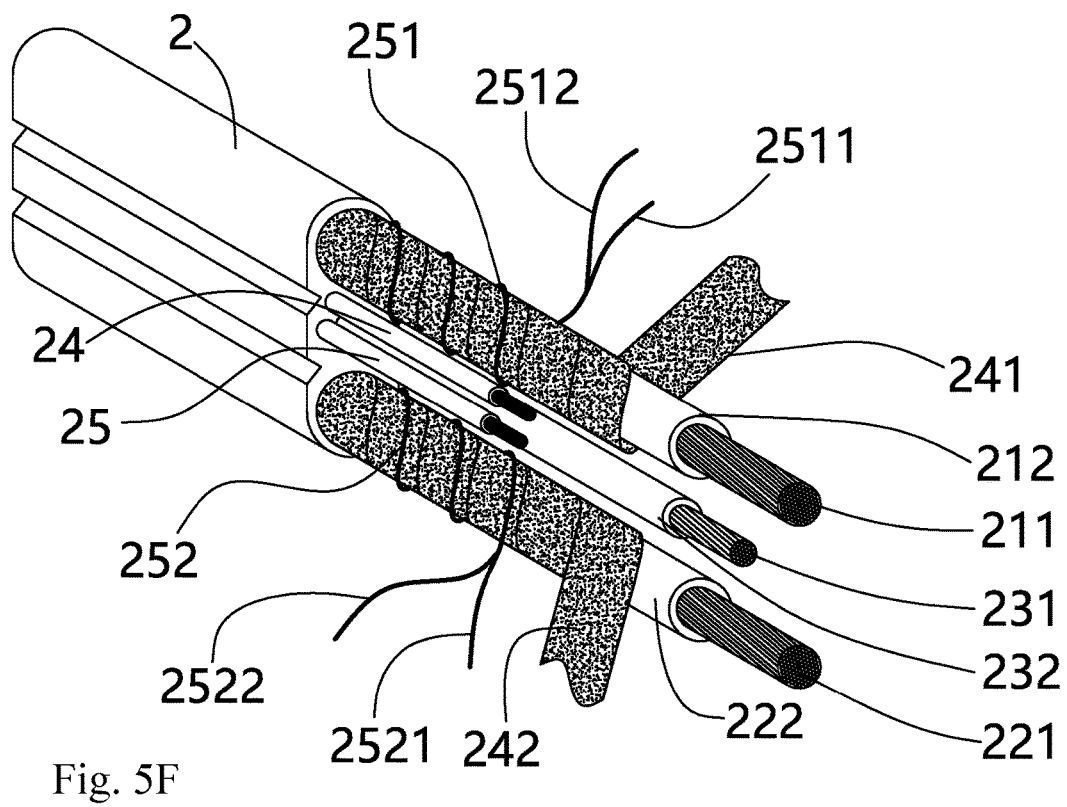
FIG. 5F is a partial cut-away and partially disassembled view showing the power cord of the other variation of the fourth embodiment.

Refer to FIGS. 5A and 5B. FIG. 5A is a cross-sectional view illustrating a power cord according to a fourth embodiment of the present invention. FIG. 5B is a partial cut-away and partially disassembled view showing the power cord of the fourth embodiment. Comparing to the embodiment of FIGS. 2A and 2B, in the embodiment of FIGS. 5A and 5B, the power cord 2 has an oblong cross-sectional shape with the power supply lines arranged in a linear configuration. The shield insulating layer 26 is molded as an integral structure, covering the surfaces of the first shield layer 241, first signal conductor 251, second shield layer 242, and second signal conductor 252. The other aspects of the power cord 2 of FIGS. 5A and 5B are similar or identical to those of the embodiment of FIGS. 2A and 2B.

Figure 6A:
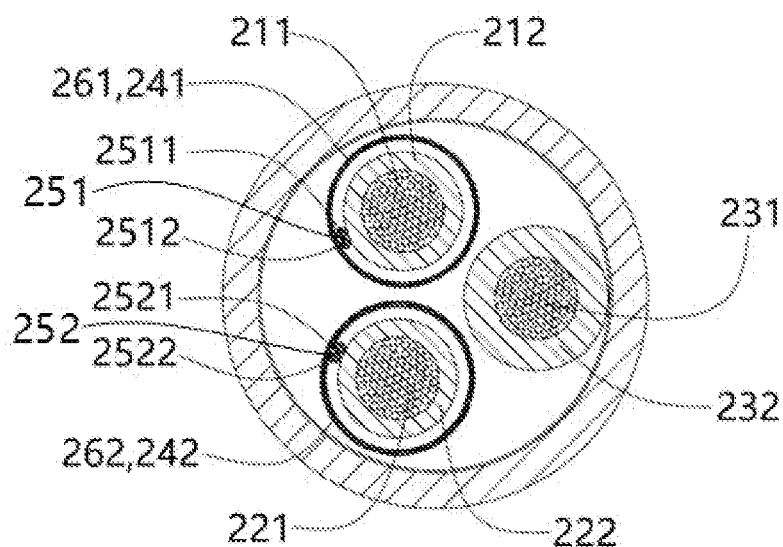
FIG. 6A is a cross-sectional view illustrating a power cord according to a fifth embodiment of the present invention.
Figure 6B:
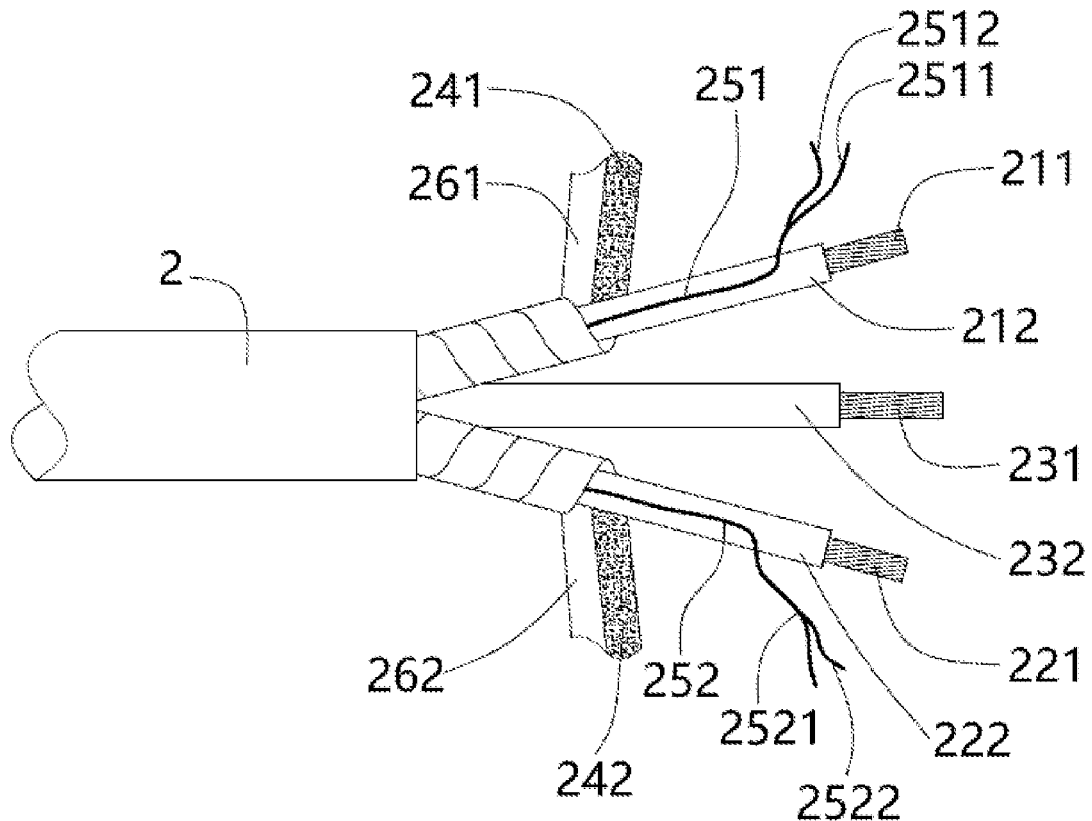
FIG. 6B is a partial cut-away and partially disassembled view showing the power cord of the fifth embodiment.

Refer to FIGS. 6A and 6B. FIG. 6A is a cross-sectional view illustrating a power cord according to a fifth embodiment of the present invention. FIG. 6B is a partial cut-away and partially disassembled view showing the power cord of the fifth embodiment. Comparing to the embodiment of FIGS. 3A and 3B, in the embodiment of FIGS. 6A and 6B, the first signal conductor 251 is disposed substantially parallel to the first power supply line 211 (rather than wound around it) between the first shield layer 241 and first insulation layer 212, and the second signal conductor 252 is disposed substantially parallel to the first power supply line 212 (rather than wound around it) between the second shield layer 242 and second insulation layer 222. The other aspects of the power cord 2 of FIGS. 6A and 6B are similar or identical to those of the embodiment of FIGS. 3A and 3B.

Figure 7:
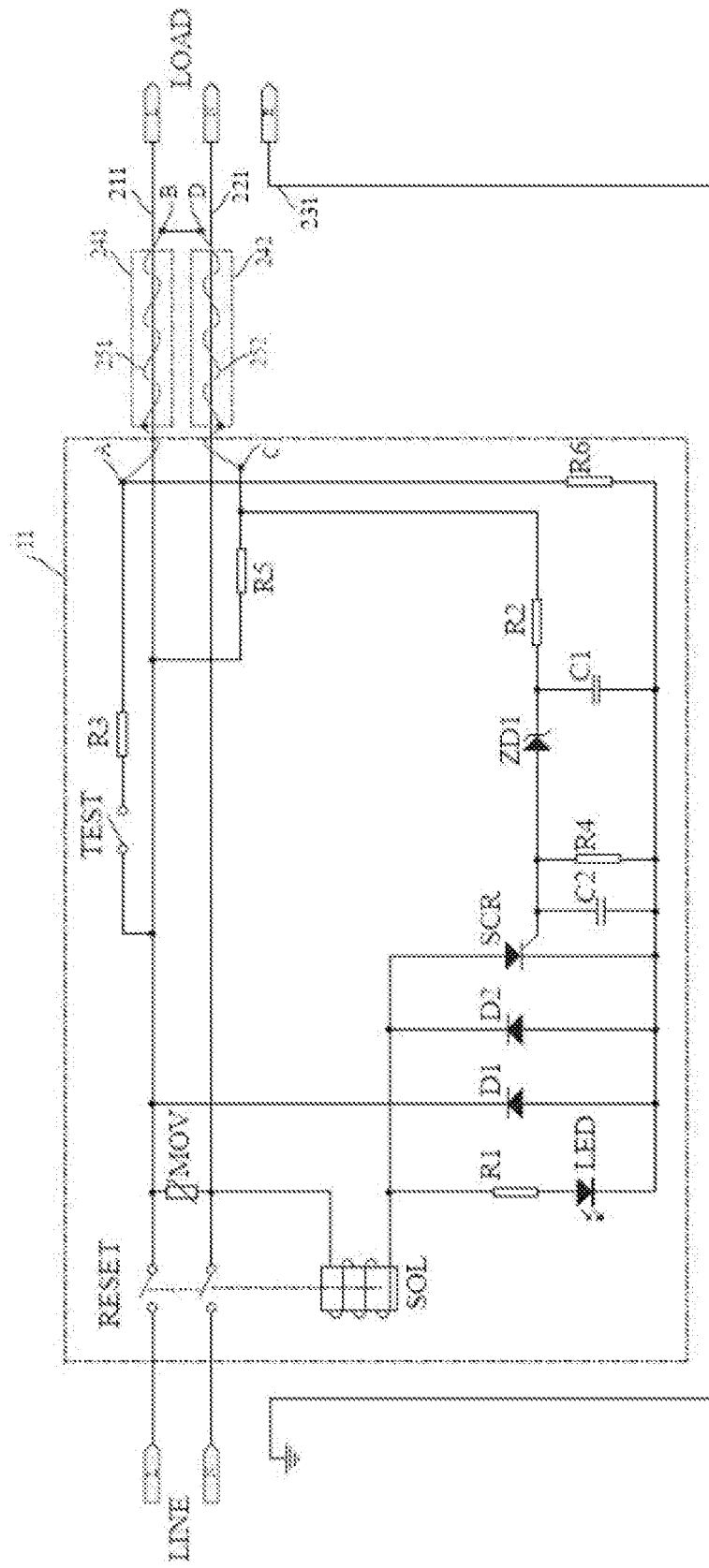
FIG. 7 is a first circuit diagram showing an LCDI device incorporating a power cord of an embodiment of the present invention.

Refer to FIG. 7, which is a first circuit diagram showing an LCDI device incorporating a power cord of an embodiment of the present invention. As shown in FIG. 7, the first shield layer 241 is electrically coupled to the first signal conductor 251, and the second shield layer 242 is electrically coupled to the second signal conductor 252. A first end B (the end closer to the load) of the first signal conductor 251 is electrically coupled to a first end D (the end closer to the load) of the second signal conductor 252. A second end A (the end farther away from the load) of the first signal conductor 251 and a second end C (the end farther away from the load) of the second signal conductor 252 are coupled to the electrical processing circuit 11.

When a leak occurs on the first power supply line 211, a leakage current flows through the path 241-251-252-R2-ZD1, which generates a voltage signal that triggers the silicon controlled rectifier SCR to become conductive. As a result, a current path is formed from the second power supply line 221 via SOL-SCR-D1 to the first power supply line 211, so that a sufficiently large current flows through the solenoid SOL and generates a magnetic field to drive the reset switch RESET to trip, disconnecting the power supply from the input end LINE to the output end LOAD. Similarly, when a leak occurs on the second power supply line 221, a leakage current flows through the path 242-252-R2-ZD1, causing the reset switch RESET to trip in a similar manner.

Figure 8:
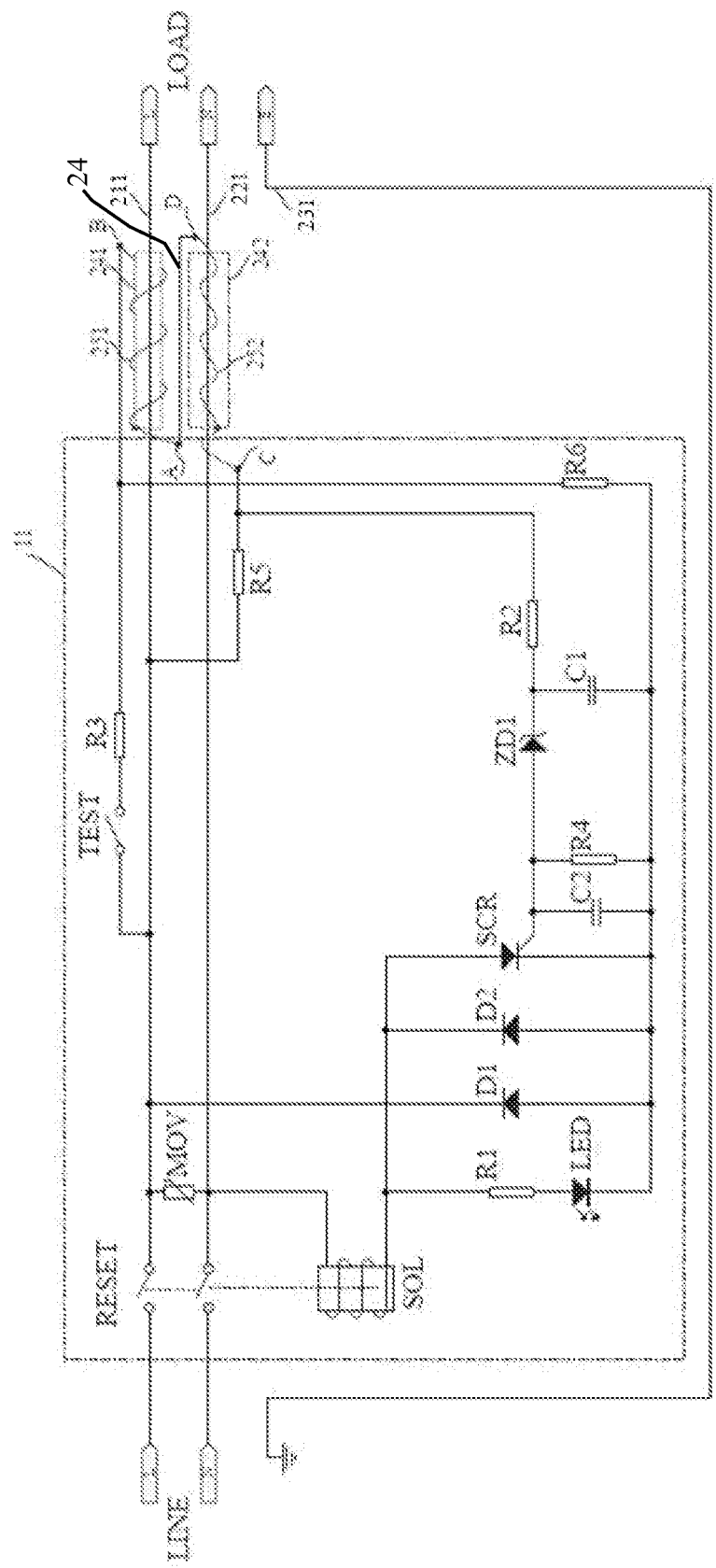
FIG. 8 is a second circuit diagram showing an LCDI device incorporating a power cord of an embodiment of the present invention.

Refer to FIG. 8, which is a second circuit diagram showing an LCDI device incorporating a power cord of an embodiment of the present invention. A main difference between FIG. 8 and FIG. 7 is that, in FIG. 8, the first signal conductor 251 is wound around the outside surface of the first shield layer 241; the second end A of the first signal conductor 251 and the first end D of the second signal conductor 252 are electrically coupled to each other by a conductor line 24, while the first end B of the first signal conductor 251 and second end C of the second signal conductor 252 are coupled to the electrical processing circuit 11.

When a leak occurs on the first power supply line 211, a leakage current flows through the path 241-251-252-R2-ZD1, which generates a voltage signal that triggers the silicon controlled rectifier SCR to become conductive. As a result, a current path is formed from the second power supply line 221 via SOL-SCR-D1 to the first power supply line 211, so that a sufficiently large current flows through the solenoid SOL and generates a magnetic field to drive the reset switch RESET to trip, disconnecting the power supply from the input end LINE to the output end LOAD. Similarly, when a leak occurs on the second power supply line 221, a leakage current flows through the path 242-252-R2-ZD1, causing the reset switch RESET to trip in a similar manner.

Figure 9:
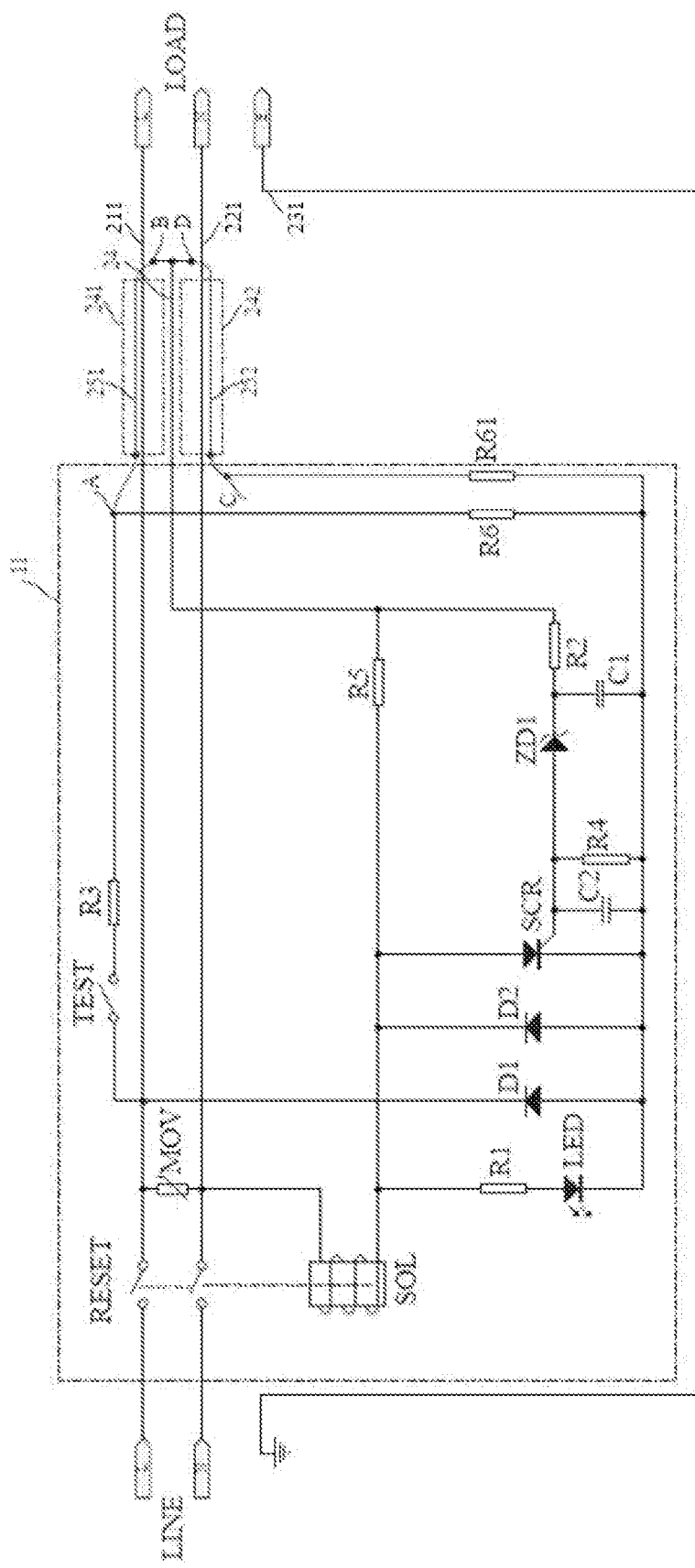
FIG. 9 is a third circuit diagram showing an LCDI device incorporating a power cord of an embodiment of the present invention.

Refer to FIG. 9, which is a third circuit diagram showing an LCDI device incorporating a power cord of an embodiment of the present invention. A main difference between FIG. 9 and FIG. 7 is that, in FIG. 9, the first signal conductor 251 is substantially parallel to (rather than wound around) the first power supply line 211 and the second signal conductor 252 is substantially parallel to (rather than wound around) the second power supply line 221. The first end B of the first signal conductor 251 and the first end D of the second signal conductor 252 are coupled to each other, and are coupled to the electrical processing circuit 11 via a conductor line 24. The second A of the first signal conductor 251 and the second end C of the second signal conductor 252 are also coupled to the electrical processing circuit 11.

When a leak occurs on the first power supply line 211, a leakage current flows through the path 241-251-R2-ZD1, which generates a voltage signal that triggers the silicon controlled rectifier SCR to become conductive. As a result, a current path is formed from the second power supply line 221 via SOL-SCR-D1 to the first power supply line 211, so that a sufficiently large current flows through the solenoid SOL and generates a magnetic field to drive the reset switch RESET to trip, disconnecting the power supply from the input end LINE to the output end LOAD. Similarly, when a leak occurs on the second power supply line 221, a leakage current flows through the path 242-252-R2-ZD1, causing the reset switch RESET to trip in a similar manner.

Figure 10:
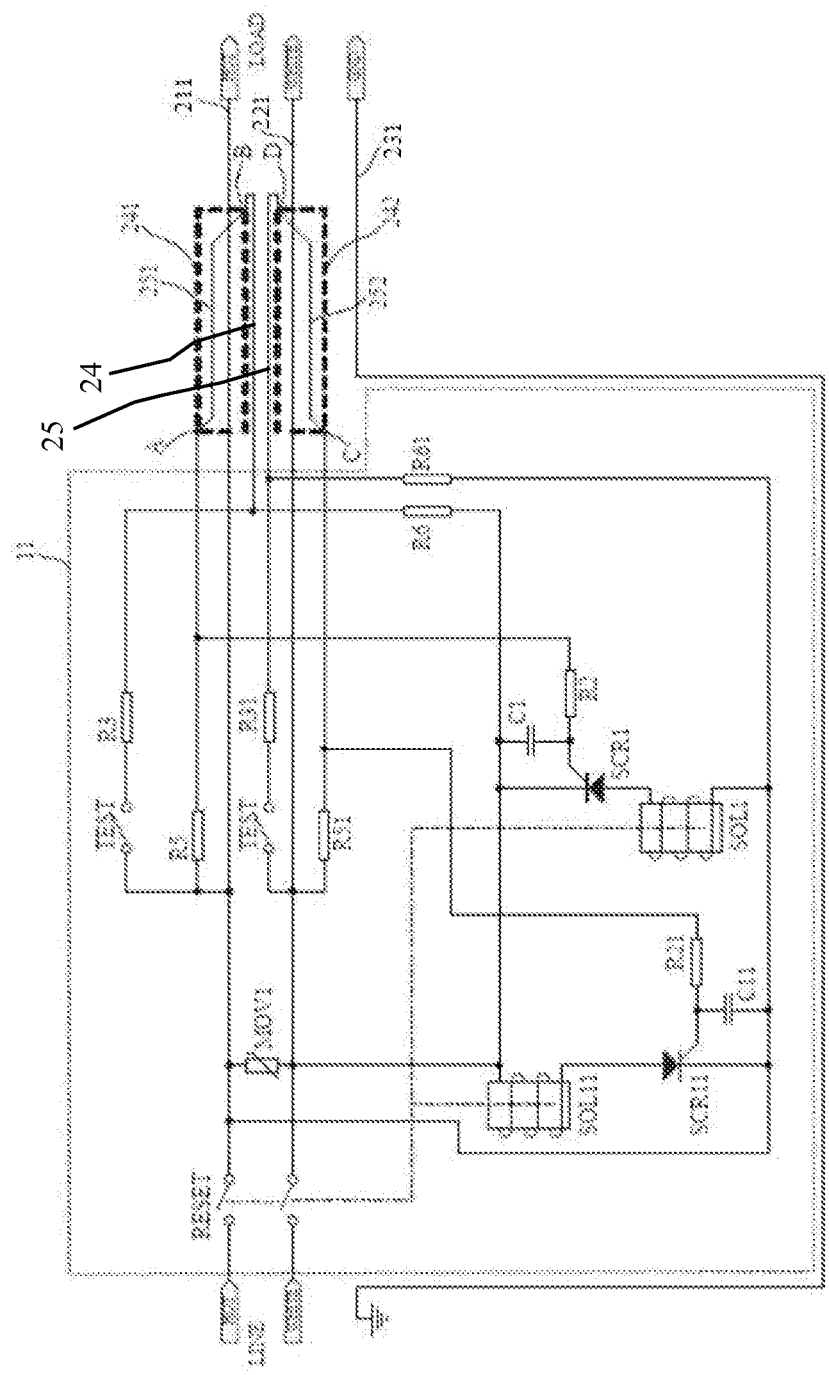
FIG. 10 is a fourth circuit diagram showing an LCDI device incorporating a power cord of an embodiment of the present invention.

Refer to FIG. 10, which is a fourth circuit diagram showing an LCDI device incorporating a power cord of an embodiment of the present invention. In FIG. 10, the first shield layer 241 is electrically coupled to the first signal conductor 251, and the second shield layer 242 is electrically coupled to the second signal conductor 252. The first and second ends B and A of the first signal conductor 251 are coupled to the electrical processing circuit 11 (via a conductor line 24 for point B), and the first and second ends D and C of the second signal conductor 252 are also coupled to the electrical processing circuit 11 (via a conductor line 25 for point D), but the first signal conductor 251 and second signal conductor 252 are not coupled to each other.

When a leak occurs on the first power supply line 211, a leakage current flows through the path 241-251-R2, which generates a voltage signal that triggers the silicon controlled rectifier SCR1 to become conductive. As a result, a current path is formed from the first power supply line 211 via SOL1-SCR1 to the second power supply line 221, so that a sufficiently large current flows through the solenoid SOL1 and generates a magnetic field to drive the reset switch RESET to trip, disconnecting the power supply from the input end LINE to the output end LOAD. Similarly, when a leak occurs on the second power supply line 221, a leakage current flows through the path 242-252-R21, which triggers the silicon controlled rectifier SCR11 to become conductive. As a result, a current path is formed from the second power supply line 221 via SOL11-SCR11 to the first power supply line 211, so that a sufficiently large current flows through the solenoid SOL11 and generates a magnetic field to drive the reset switch RESET to trip, disconnecting the power supply from the input end LINE to the output end LOAD.

In the circuits of FIGS. 8, 9 and 10, the power cord 2 includes one or more conductor lines 24 and 25 as well as the other structures already described. Such a cord may be implemented by structures similar to those shown in FIGS. 1-6B but additionally include the conductor(s). For example, the power cord shown in FIGS. 3C-3D and FIGS. 3E-3F are similar to that shown in FIGS. 3A-3B but additionally include one or two conductor lines 24 or 24 and 25. The power cord shown in FIGS. 5C-5D and FIGS. 5E-5F are similar to that shown in FIGS. 5A-5B but additionally include one or two conductor lines 24 or 24 and 25. Each of the conductor lines 24 and 25 is electrically insulated from the other wires and may be disposed anywhere in the cable.

The cables shown in FIGS. 2A-2B, 4A-4B and 6A-6B may be similarly modified to include one or more additional conductor lines.

Some additional embodiments of the present invention provide an electrical power connection device, which includes an LCDI device and a power cord according to any one of the above embodiments electrically coupled to the LCDI device.

Other additional embodiments of the present invention provide an electrical appliance, which includes an electrical load, and the above electrical power connection device coupled between a power supply and the load to supply power to the load.

While the present invention is described above using specific examples, these examples are only illustrative and do not limit the scope of the invention. It will be apparent to those skilled in the art that various modifications, additions and deletions can be made to the power cord of the present invention without departing from the spirit or scope of the invention.

What is claimed is:

1. A power cord, comprising:
   at least two power supply lines;
   at least two insulation layers respectively covering corresponding ones of the at least two power supply lines;
   a first shield layer and a second shield layer, respectively disposed around corresponding two of the at least two insulating layers, respectively configured to detect leakage currents on the corresponding power supply lines;
   at least one shield insulating layer, disposed between the first and second shield layers, configured to electrically insulate the first and second shield layers from each other;
   a first signal conductor disposed either between the first shield layer and the corresponding insulation layer or outside the first shield layer, and electrically coupled to the first shield layer; and
   a second signal conductor disposed either between the second shield layer and the corresponding insulation layer or outside the second shield layer, and electrically coupled to the second shield layer;
   wherein each of the first and second signal conductors is formed of at least one conductor wire and at least one non-conductive filament in a twisted or woven structure.

2. The power cord of claim 1, wherein the conductor wire is a metal wire or a carbon filament, and the non-conductive filament is a Kevlar filament, a nylon filament, or a glass filament.

3. The power cord of claim 1, wherein the first and second signal conductors have superior solderability than the first and second shield layers.

4. The power cord of claim 1, wherein the first signal conductor is either disposed in parallel with or spiral wound around the corresponding power supply line.

5. The power cord of claim 1, wherein the second signal conductor is either disposed in parallel with or spiral wound around the corresponding power supply line.

6. The power cord of claim 1, wherein the first shield layer is independent of the at least one shield insulating layer, and/or the second shield layer is independent of the at least one shield insulating layer.

7. A power cord, comprising:
   at least two power supply lines;
   at least two insulation layers respectively covering corresponding ones of the at least two power supply lines;

a first shield layer and a second shield layer, respectively disposed around corresponding two of the at least two insulating layers, respectively configured to detect leakage currents on the corresponding power supply lines;

at least one shield insulating layer, disposed between the first and second shield layers, configured to electrically insulate the first and second shield layers from each other;

a first signal conductor disposed either between the first shield layer and the corresponding insulation layer or outside the first shield layer, and electrically coupled to the first shield layer; and a second signal conductor disposed either between the second shield layer and the corresponding insulation layer or outside the second shield layer, and electrically coupled to the second shield layer;

wherein each of the first and second signal conductors is formed of at least one conductor wire and at least one filament in a twisted or woven structure, wherein the first shield layer is formed integrally with one of the at least one shield insulating layer as an integral structure, and wherein at least a portion of an inner surface of the integral structure is the first shield layer; and/or the second shield layer is formed integrally with one of the at least one shield insulating layer as an integral structure, and wherein at least a portion of an inner surface of the integral structure is the second shield layer.

8. The power cord of claim 7, wherein an area of the first shield layer is smaller than an area of the one of the at least one shield insulating layer, and/or an area of the second shield layer is smaller than an area of the one of the at least one shield insulating layer.

9. The power cord of claim 1, wherein the at least one shield insulating layer covers at least one of the first shield layer, the second shield layer, the first signal conductor, and the second signal conductor, and wherein the at least one shield insulating layer is formed of an insulating plastic film or insulating paper.

10. The power cord of claim 1, wherein the first signal conductor and second signal conductor are electrically coupled to each other.

11. The power cord of claim 1, wherein the first signal conductor and second signal conductor are electrically isolated from each other.

12. An electrical connector, comprising:
a leakage current detection and interruption device; and
the power cord of claim 1, electrically coupled to the leakage current detection and interruption device.

13. An electrical appliance, comprising:
an electrical load; and
the electrical connector of claim 12, coupled between an electrical power source and the load, configured to supply power to the electrical load.

14. The power cord of claim 7, wherein the first and second signal conductors have superior solderability than the first and second shield layers.

15. The power cord of claim 7, wherein the first signal conductor is either disposed in parallel with or spiral wound around the corresponding power supply line, and the second signal conductor is either disposed in parallel with or spiral wound around the corresponding power supply line.

16. The power cord of claim 7, wherein the at least one shield insulating layer covers at least one of the first shield layer, the second shield layer, the first signal conductor, and the second signal conductor, and wherein the at least one shield insulating layer is formed of an insulating plastic film or insulating paper.

17. The power cord of claim 7, wherein the first signal conductor and second signal conductor are electrically coupled to each other.

18. The power cord of claim 7, wherein the first signal conductor and second signal conductor are electrically isolated from each other.

19. An electrical connector, comprising:
a leakage current detection and interruption device; and
the power cord of claim 7, electrically coupled to the leakage current detection and interruption device.

20. An electrical appliance, comprising:
an electrical load; and
the electrical connector of claim 19, coupled between an electrical power source and the load, configured to supply power to the electrical load.

* * * * *